United States Patent
Keane et al.

(10) Patent No.: US 10,158,343 B1
(45) Date of Patent: Dec. 18, 2018

(54) PUSH-PULL TUNABLE COUPLING

(71) Applicants: Zachary Kyle Keane, Baltimore, MD (US); James R. Medford, Baltimore, MD (US)

(72) Inventors: Zachary Kyle Keane, Baltimore, MD (US); James R. Medford, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/868,607

(22) Filed: Jan. 11, 2018

(51) Int. Cl.
   *H03K 3/38* (2006.01)
   *H03H 11/04* (2006.01)
   *H03K 17/92* (2006.01)

(52) U.S. Cl.
   CPC ............. *H03H 11/04* (2013.01); *H03K 17/92* (2013.01)

(58) Field of Classification Search
   USPC .............................................. 327/528; 257/31
   See application file for complete search history.

(56) References Cited

U.S. PATENT DOCUMENTS

| | | | | |
|---|---|---|---|---|
| 6,154,026 | A * | 11/2000 | Dantsker | G01R 33/022 324/225 |
| 9,183,508 | B2 * | 11/2015 | King | G06N 99/002 |
| 9,438,246 | B1 * | 9/2016 | Naaman | H03K 19/195 |
| 9,501,748 | B2 | 11/2016 | Naaman et al. | |
| 9,647,662 | B1 * | 5/2017 | Abutaleb | H03K 19/01754 |
| 9,780,765 | B2 * | 10/2017 | Naaman | H03K 3/38 |
| 9,836,699 | B1 * | 12/2017 | Rigetti | G06N 99/002 |
| 9,892,365 | B2 * | 2/2018 | Rigetti | G06N 99/002 |
| 2008/0215850 | A1 * | 9/2008 | Berkley | B82Y 10/00 712/1 |
| 2008/0238531 | A1 * | 10/2008 | Harris | B82Y 10/00 327/528 |
| 2008/0258753 | A1 * | 10/2008 | Harris | B82Y 10/00 326/4 |

(Continued)

FOREIGN PATENT DOCUMENTS

JP 2000286472 A * 10/2000

OTHER PUBLICATIONS

Chen, et al.: "Qubit Architecture with High Coherence and Fast Tunable Coupling", Physical Review Letters; PRL 113, 220502 (2014), Nov. 28, 2014-pp. 220502-1 thru 220502-5.

(Continued)

*Primary Examiner* — Adam Houston
(74) *Attorney, Agent, or Firm* — Tarolli, Sundheim, Covell & Tummino LLP (57) ABSTRACT

A push-pull tunable coupler includes a push transformer, a pull transformer and two compound Josephson junctions arranged in upper and lower branches. Absent biasing, the balanced push and pull of current between the branches causes current from a first object to circulate within a loop and not to be coupled to a second object. Biasing of at least one of the compound Josephson junctions unbalances the push and pull of current in the branches to couple the first and second objects. The coupler has reduced sensitivity to differential-mode noise around the off state, is completely insensitive to common-mode noise, and is capable of inverting the coupled signal with appropriate relative biasing of the compound Josephson junctions.

20 Claims, 7 Drawing Sheets

(56) References Cited

U.S. PATENT DOCUMENTS

| | | | | |
|---|---|---|---|---|
| 2008/0274898 | A1* | 11/2008 | Johnson | B82Y 10/00 505/190 |
| 2009/0078932 | A1* | 3/2009 | Amin | B82Y 10/00 257/31 |
| 2010/0194466 | A1* | 8/2010 | Yorozu | B82Y 10/00 327/528 |
| 2011/0057169 | A1* | 3/2011 | Harris | B82Y 10/00 257/31 |
| 2011/0060780 | A1* | 3/2011 | Berkley | B82Y 10/00 708/207 |
| 2012/0044717 | A1* | 2/2012 | Suntio | H02M 3/33523 363/17 |
| 2015/0111754 | A1* | 4/2015 | Harris | G06N 99/002 505/170 |
| 2015/0254571 | A1* | 9/2015 | Miller | G06N 99/002 326/3 |
| 2016/0335558 | A1* | 11/2016 | Bunyk | G06F 15/82 |
| 2017/0116542 | A1* | 4/2017 | Shim | G06N 99/002 |
| 2017/0160356 | A1* | 6/2017 | Liu | G01R 33/3657 |
| 2017/0212860 | A1* | 7/2017 | Naaman | G06F 13/4027 |
| 2018/0123634 | A1* | 5/2018 | Settaf | H03F 3/24 |
| 2018/0145631 | A1* | 5/2018 | Berkley | H01P 7/08 |
| 2018/0240034 | A1* | 8/2018 | Harris | G06N 99/002 |
| 2018/0246848 | A1* | 8/2018 | Douglass | G06F 15/803 |

OTHER PUBLICATIONS

Majer, et al.: "Coupling Superconducting Qubits Via a Cavity Bus", Nature, vol. 449, Sep. 27, 2007, doi:10.1038/nature06184, pp. 443-447.

Srinivasan, et al.: "Tunable Coupling in Circuit Quantum Electrodynamics Using a Superconducting Charge Qubit wth a V-Shaped Energy Level Diagram"; American Physical Society, Physical Review Letters, PRL 106, 083601 (2011), Feb. 25, 2011, pp. 083601-1 thru 083601-4.

* cited by examiner

PUSH-PULL TUNABLE COUPLING

GOVERNMENT INTEREST

The invention was made under Government Contract Number 30069353. Therefore, the US Government has rights to the invention as specified in that contract.

TECHNICAL FIELD

The present invention relates generally to superconducting circuits, and specifically to push-pull tunable coupling of quantum objects.

BACKGROUND

Conventional microwave mechanical, electro-mechanical, and electronic switches may not compatible with on-chip integration with, and cryogenic operation of, superconducting electronic circuits, because of incompatible fabrication processes and high power dissipation. Likewise, tunable filters that are commonly realized by use of either active components such as voltage-variable capacitors (i.e., varactors), mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffers from high return loss, limited usable bandwidth, and poor out-of-band off-state isolation.

In certain superconducting contexts, a coupler can be provided to exchange information between objects by turning on some coupling between them, or to isolate the objects by turning off that coupling. A tunable coupler is one that controls a degree of signal coupling between two objects, i.e., between pure "on" (coupled) and pure "off" (uncoupled) states, by the provision of one or more variable control signals.

SUMMARY

The present disclosure provides a tunable superconducting coupler that is relatively insensitive to both global flux offsets and small perturbations on control lines, particularly as compared to a tunable coupler implemented as an inductive current divider incorporating a tunable inductance.

In one example, a superconducting push-pull tunable coupler system is provided. The system includes a push-pull tunable coupler having a push transformer, a pull transformer, and first and second compound Josephson junctions. First and second objects are connected to first and second ports of the coupler, respectively. At least one bias element is configured to bias at least one of the first or second compound Josephson junction to unbalance the push and pull of the coupler transformers. The coupler is configured such that a balance between the transformers establishes a differential mode in which the first and second objects are uncoupled to prevent signals from passing between the objects, and an imbalance between the transformers establishes a common mode in which the objects are coupled to pass signals between the objects.

In another example, there is provided a method of tunably coupling or uncoupling two objects. A signal from a first object is divided into two superconducting branches. Each branch of the signal is transformer-coupled to a respective compound Josephson junction. At least a first control signal is applied to bias at least one of the compound Josephson junctions, thereby coupling the first object to a second object by permitting the exchange of information between the objects via a coupling signal.

Yet another example provides a superconducting load-compensated tunable coupler. The coupler has a split inductor to receive an input signal from a first object at an input node located between the ends of the split inductor, each end of the split inductor being connected to a low-voltage rail (e.g., ground). The coupler is divided into upper and lower branches. The upper branch has a first flux transformer with an upper portion of the split inductor and a second inductor, transformer-coupled to the upper portion of the split inductor, connected between the low-voltage rail and an upper-middle node, the configuration of the connections of the first flux transformer to the low voltage rail giving the first flux transformer a first polarity. The upper branch further includes a first compound Josephson junction connected between the upper-middle node and an output node. The lower branch has a second flux transformer with a lower portion of the split inductor and a third inductor, transformer-coupled to the lower portion of the split inductor, connected between the low-voltage rail and a lower-middle node, the configuration of the connections of the second flux transformer to the low voltage rail giving the second flux transformer a second polarity opposite to the first polarity. The lower branch further includes a second compound Josephson junction connected between the lower-middle node and the output node.

DETAILED DESCRIPTION

This disclosure relates generally to superconducting circuits, and more particularly to a superconducting push-pull coupler between two objects. The push-pull coupler described herein can consist, for example, of a pair of matched compound Josephson junctions or superconducting quantum interference device (SQUID) loops connected in parallel. Each compound Josephson junction or SQUID loop is driven by a mutual inductive coupling to a signal source. The provided tunable coupler thereby avoids the drawback of a steep tuning curve around zero coupling, making it easier to preserve the off state, even in the face of noisy control lines. Specifically, the tunable coupler described herein preserves its off state by being first-order insensitive to flux noise and by being insensitive to any common-mode flux in the off state.

Figure 1:
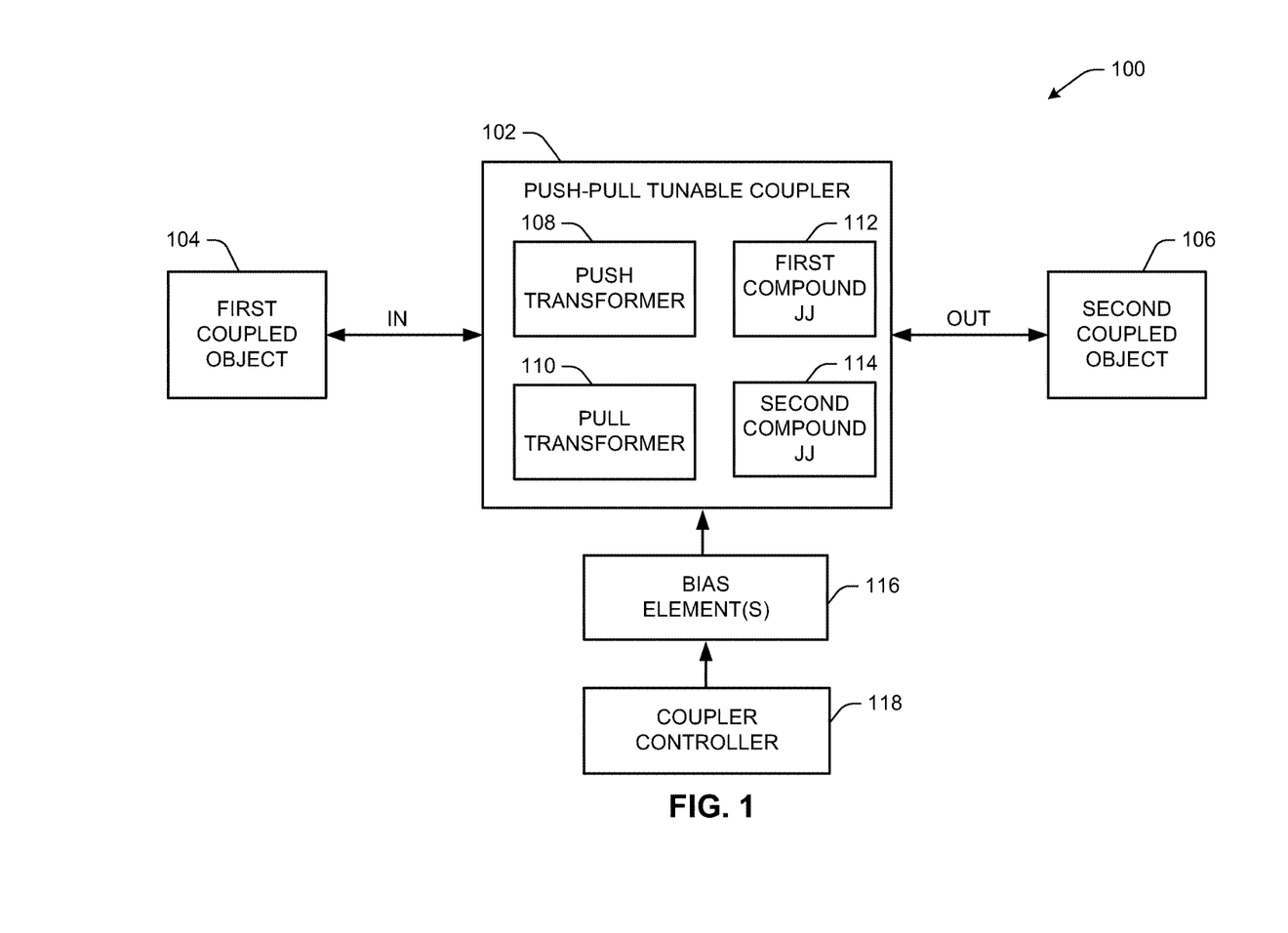
FIG. 1 is a block diagram of an example superconducting push-pull tunable coupler.

FIG. 1 illustrates a push-pull tunable coupler system 100 in which two objects 104, 106 can be controllably coupled and decoupled via a push-pull tunable coupler 102. Each coupled object 104, 106 can be, for example, a quantum object, e.g., a qubit, or some resonant object, e.g., a transmission line of particular length and impedance (not including a Josephson transmission line (JTL), which is an active device). The push-pull tunable coupler system 100 can be implemented in any of a variety of superconducting circuit systems to provide coupling and decoupling between quantum objects (e.g., qubits, resonators). The signals exchanged between the coupled objects can be, for example, microwave signals that are implemented in a control scheme for a quantum circuit, such as performing a gate or a readout operation on a qubit. As another example, the signals can be a signal pulse, a communication signal, or a control command signal. The push-pull tunable coupler system 100 can operate at cryogenic temperatures, can dissipate substantially no power, and can be controlled with single flux quantum (SFQ) compatible signals. As used herein, the terms "coupling current" or "coupling signals" mean current or signals exchanged between one coupled object and another when the coupler is in the "on" state.

As illustrated in FIG. 1, the push-pull tunable coupler system 100 includes a push-pull tunable coupler 102 having a push transformer 108, a pull transformer 110, a first compound Josephson junction 112, and a second compound Josephson junction 112. The first object 104 can be connected to a first port of the coupler 102 and the second object can be connected to a second port of the coupler 102. Although these ports have been nominally labeled "IN" and "OUT" in FIG. 1 for simplicity of discussion, the transmission of signals or exchange of information between the coupled objects can be bidirectional. As an example, the coupler 102 can arrange its transformers 108, 110 and compound Josephson junctions 112, 114 as upper and lower branches. For example, the first port can branch signals from the first object among a split inductor, one portion of the split inductor forming part of the push transformer and another portion of the split inductor forming part of the pull transformer.

One or more bias elements 116 can bias one or both of the first or second compound Josephson junction to unbalance the push and pull of the coupler transformers. For example, one or more of the bias elements can include a flux bias line transformer-coupled to part of the coupler 102, e.g., to one of the compound Josephson junctions 112, 114. For example, the inductance of the Josephson junctions can be switched between a low inductance state for coupling objects to one another and to pass signals between the coupled objects, and a high inductance state to decouple the objects from one another to block signals from passing between the decoupled objects.

The relationship between the transformers 108, 110 (and/or branches) can be such that one "pushes" current from object 104 while the other "pulls" it. The coupler 102 can be configured such that a balance between the "push" and the "pull" of the transformers 108, 110 can establish a differential mode in which the first and second objects 104, 106 are uncoupled to prevent signals from passing between the objects 104, 106, and an imbalance between the "push" and "pull" of the transformers 108, 110 can establish a common mode in which the objects are coupled to pass signals between the objects.

A coupler controller 118 can control the setting of the coupler 102 between the differential mode and the common mode, or between an "off" state and various degrees of an "on" state, by changing the compound Josephson junctions between opposing inductance states and thereby balancing or unbalancing the coupler 102 to various degrees. For example, the coupler controller 118 can control an amount and polarity of control current through at least one bias element 116, e.g., through at least one flux bias control line inductively coupled to at least one of the first and second compound Josephson junctions 112, 114, to alternate the coupler 102 between the differential mode and the common mode. The coupler 102 may also be configured to invert a coupling current or coupling signal between the two objects 104, 106, when, for example, one control current provided via one bias element 116 is greater than another control current provided through a different bias element 116.

Figures 2A, 2B, 2C:
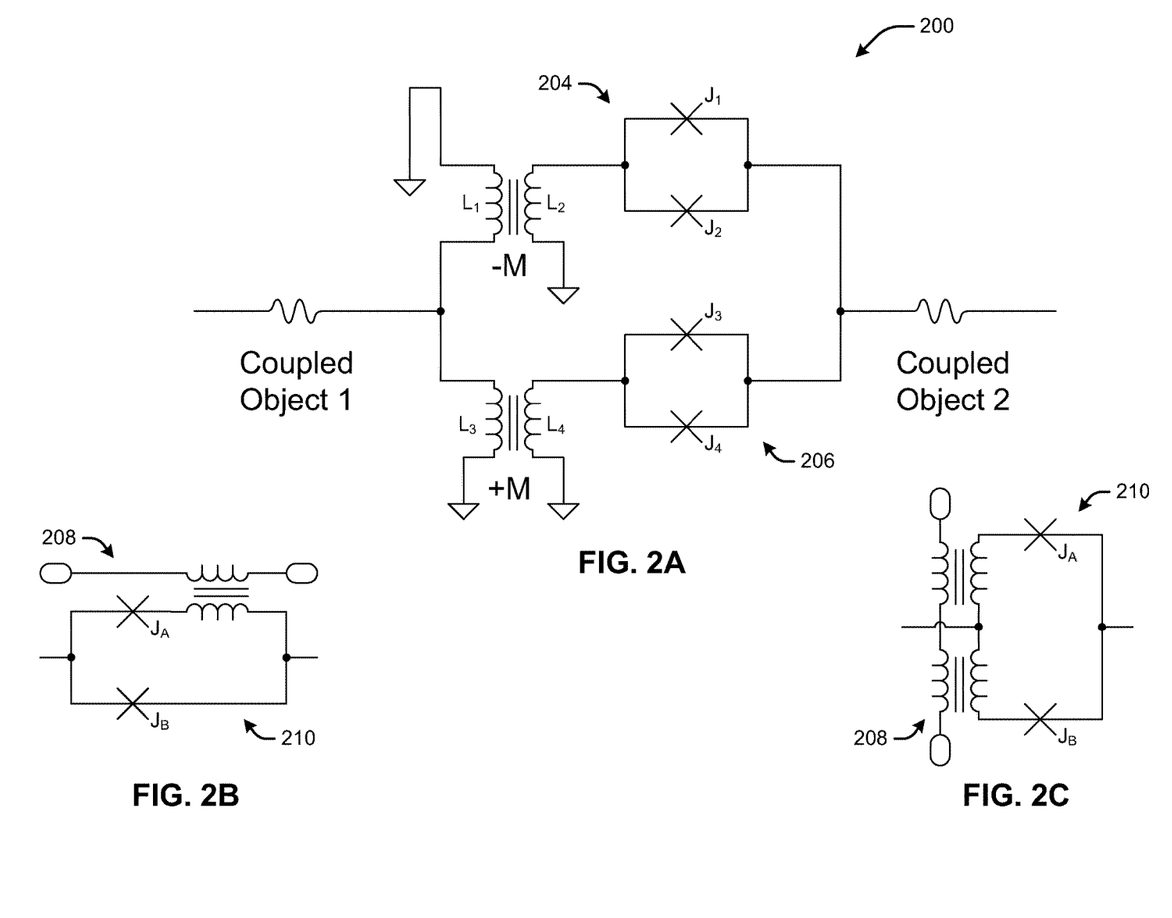
FIG. 2A is a schematic diagram of an example superconducting push-pull tunable coupler.
FIGS. 2B and 2C show examples of transformer coupling a flux bias line into a compound Josephson junction.

FIG. 2A illustrates a schematic diagram of an example tunable bidirectional coupler circuit 200. In the illustrated example, an upper-branch compound Josephson junction 204 comprises a first Josephson junction $J_1$ and a second Josephson junction $J_2$, and a lower-branch compound Josephson junction 206 comprises a third Josephson junction $J_3$ and a fourth Josephson junction $J_4$. Current from Coupled Object 1 drives a split inductor $L_1$, $L_3$. Each branch of the split inductor is coupled, via a respective flux transformer −M, +M, to the pair of compound Josephson junctions 204, 206. The mutual inductances of the two flux transformers are configured to have equal and opposite sign. Performance of the coupler 200 is improved when the Josephson junctions are well-matched to each other, but the design degrades gracefully with component mismatches. Thus, in some examples, all four Josephson junctions $J_1$, $J_2$, $J_3$, $J_4$ are substantially equal in size, e.g., within 10% of each other in size, e.g., within 5% of each other in size.

One or more control signals can be provided to the circuit of FIG. 2A as flux bias lines to bias one or both compound Josephson junctions. For simplicity, as drawn, FIG. 2A omits any flux bias lines. FIGS. 2B and 2C, however, each show examples of how a flux bias line could be provided to a compound Josephson junction, by providing such a bias line or control line 208 with one or more inductors transformer-coupled to a compound Josephson junction loop 210 comprising Josephson junctions $J_A$ and $J_B$, which can correspond to either $J_1$ and $J_2$, respectively, or $J_3$ and $J_4$, respectively, in FIG. 2A.

Because the transformers −M, +M are opposite in sign, one can be said to be "pushing" while the other is "pulling." When the "push" and "pull" are balanced, the voltages induced at the top of the −M transformer and the top of the +M transformer are equal and opposite, thus no voltage appears at the input to Coupled Object 2, and the current just flows in a loop within the coupler itself and no coupling is induced between the two objects. Stated another way, when the compound Josephson junctions 204, 206 are equally biased (or both unbiased), their Josephson inductances are also equal, and equal and opposite currents are induced in the upper and lower branches of the coupler. Thus, all current flows in the differential mode, which might also be called a circulating mode, and no current couples into Coupled Object 2. In this mode, the push of one transformer is equal to the "pull" of the other transformer.

In contrast, by biasing one loop or the other, a common-mode coupling of either sign can be generated, providing a net coupling between Coupled Object 1 and Coupled Object 2. For example, if upper-branch compound Josephson junction 204 is biased to increase its Josephson inductance, the branch currents are no longer equal and a net current from the lower branch flows into Coupled Object 2, producing a positive coupling between Coupled Object 1 and Coupled Object 2. Likewise, if lower-branch compound Josephson junction 206 is biased to increase its Josephson inductance, a net current from the upper branch flows into Coupled Object 2, producing a negative coupling between Coupled Object 1 and Coupled Object 2. Such negative coupling means that coupler 200 can perform as a signal inverter as well.

Figure 3:
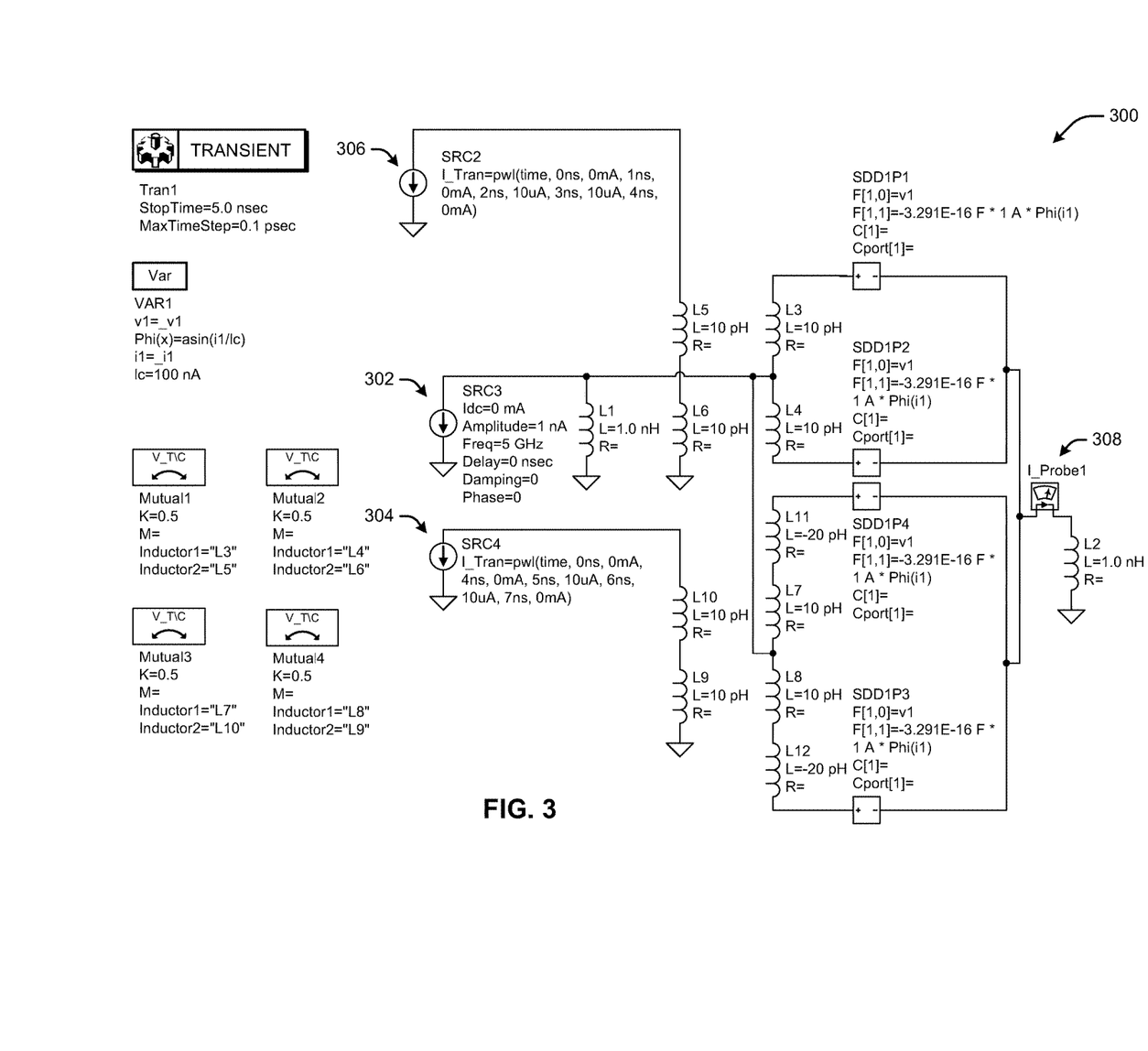
FIG. 3 is a simulation schematic of the example circuit of FIG. 2A.

FIG. 3 shows a schematic 300 of the coupler 200 of FIG. 2A as can be utilized in a simulation employing, for example, Agilent's Advanced Design Simulation (ADS) tool. SRC3 302 provides an AC signal to the coupler, in simulation of a signal provided from, for example, a quantum object. SRC4 304 provides a bias current that induces a positive coupling, and SRC2 306 provides a bias current that induces a negative coupling. These bias currents are also referred to herein as control currents. In the simulation examples described below, these control currents are programmed to be provided as piecewise linear DC currents.

Figure 4A:
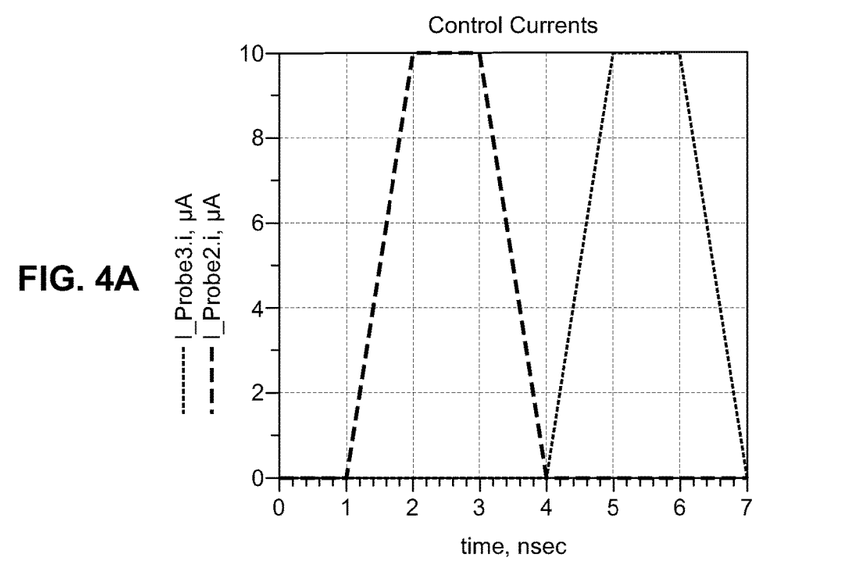
FIGS. 4A and 4B are graphs of the control and output currents, respectively, of an example simulation of the circuit of FIG. 3.
Figure 4B:
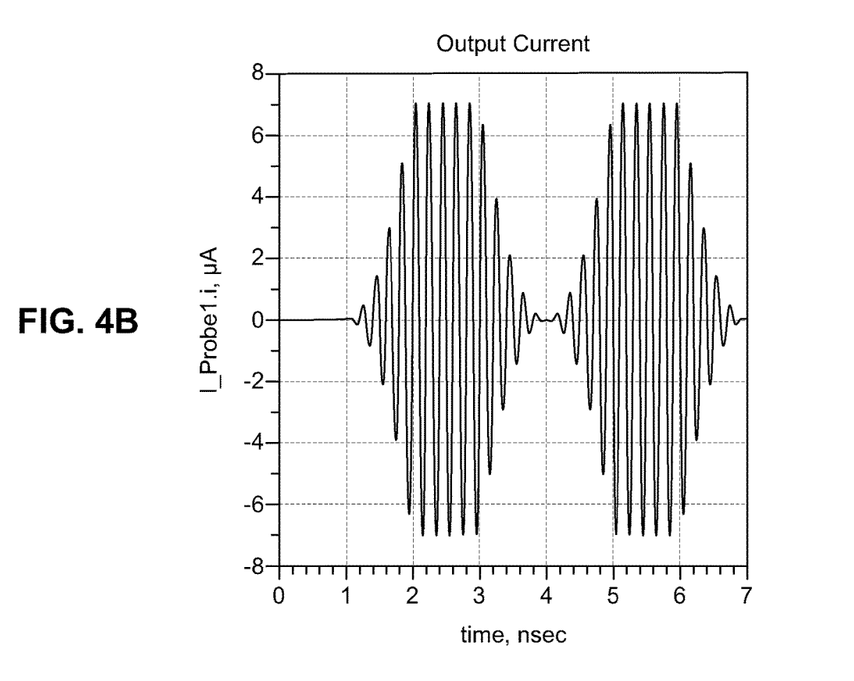

FIG. 4B illustrates the simulation output of the circuit of FIG. 3 provided the control currents of FIG. 4A. The output current is measured at I_Probe1 308 in FIG. 3. FIG. 4A illustrates two control currents superimposed on the same graph. A zero output current is indicative of uncoupling while a nonzero output current is indicative of coupling between the input and output. As shown in FIG. 3, SRC3 302 is configured to provide a 5 gigahertz signal in simulation of a signal that would be provided from Coupled Object 1 in FIG. 2A. As shown in FIG. 4A, a first control current provided to the upper-branch compound Josephson junction, e.g., from SRC2 306 in FIG. 3, labeled I_Probe2.i, is turned on starting at 1 nanosecond, to peak at 10 microamps by 2 nanoseconds, and then turned off starting at 3 nanoseconds, to return to 0 microamps by 4 nanoseconds. Subsequently, a second control current provided to the lower-branch compound Josephson junction, e.g., from SRC4 304 in FIG. 3, labeled I_Probe3.i, is turned on starting at 4 nanoseconds, to peak at 10 microamps by 5 nanoseconds, and then turned off starting at 6 nanoseconds, to return to 0 microamps by 7 nanoseconds.

Accordingly, as shown in FIG. 4B, the coupled current rises and falls, coincident with the turning on and off of the first control current, and then inverts phase and rises and falls again, coincident with the turning on and off of the second control current. FIG. 4B shows zero current at the output between 0 and 1 nanoseconds and at exactly 4 nanoseconds, consistent with both control currents being off during these times. By contrast, during times when one control current is turned on, the 5 gigahertz input AC signal provided by SRC3 302 in FIG. 3 is passed through to the output, indicating that the input has been coupled to the output. As designed, the sign of the coupled signal flips when the negative half of the coupler is turned off and the positive half of the coupler is turned on. This inversion of the output signal manifests as a mirror-image of the output signal (i.e., a 180-degree phase shift of the coupled current) at the 4-nanosecond mark.

Figure 5A:
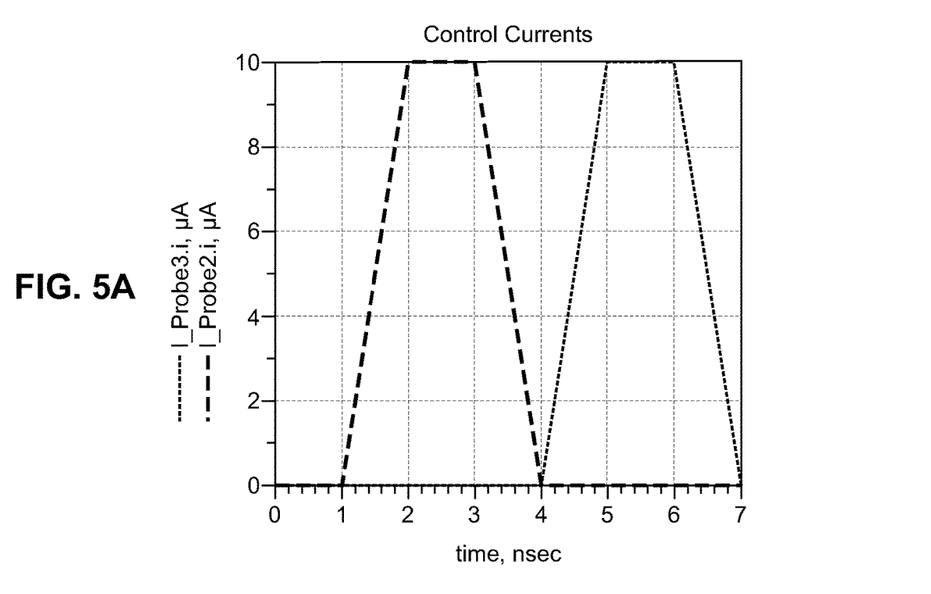
FIGS. 5A and 5B are graphs of the control and output currents, respectively, of another example simulation of the circuit of FIG. 3.
Figure 5B:
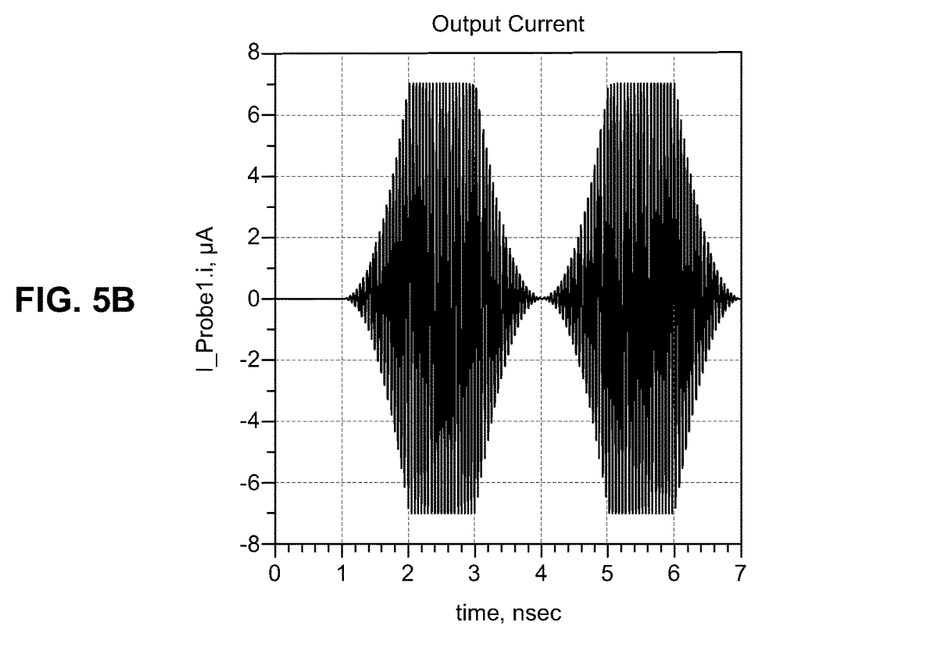

The coupler described herein is first-order insensitive to flux noise on the control lines, and it strongly suppresses global flux offsets. FIGS. 5A-B and 6A-B illustrate these attributes, respectively. FIG. 5A is identical to FIG. 4A as showing control signals applied first to the negative coupler (i.e., the upper-branch compound Josephson junction 204 of FIG. 2A) and second to the positive coupler (i.e., the lower-branch compound Josephson junction 206 of FIG. 2A). FIG. 5B shows the response of the coupler to this same set of control signals but with a higher input AC frequency of 20 gigahertz, which highlights that the turn-on of the coupler is quadratic despite the ramp in the control current being linear. FIG. 5B thus illustrates that a small signal change on either of the control lines has less effect on the amplitude of the output than a large signal change on either of the control lines. This coupler attribute provides immunity to control-line noise in a scenario where it is important to preserve the coupler "off" state.

Figure 6A:
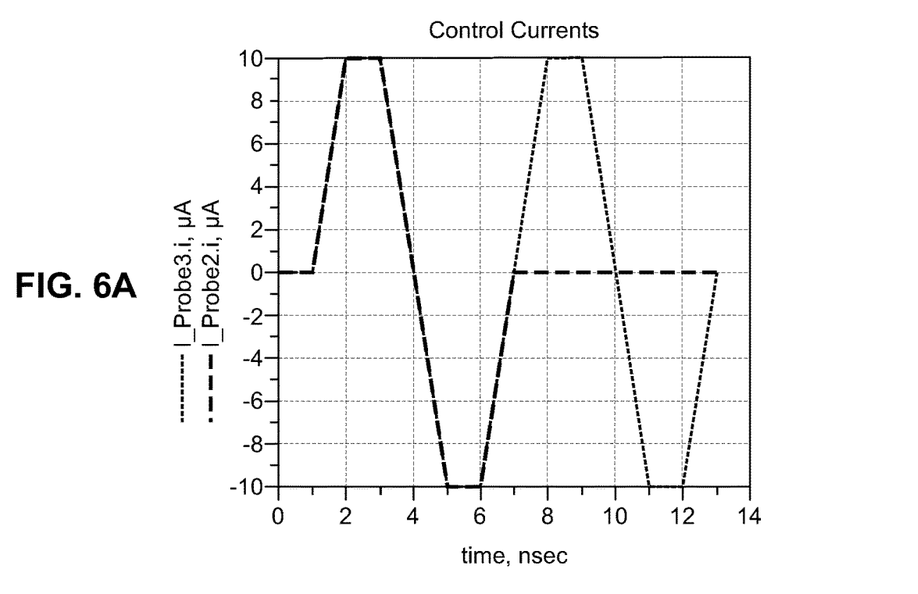
FIGS. 6A and 6B are graphs of the control and output currents, respectively, of yet another example simulation of the circuit of FIG. 3.
Figure 6B:
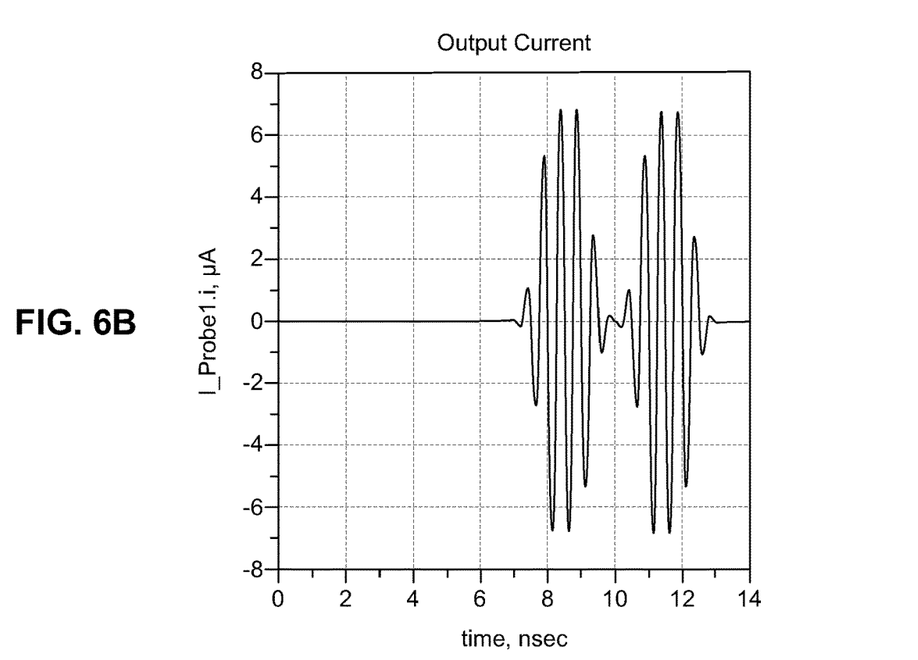

FIGS. 6A and 6B demonstrate the suppression of global flux offsets. The provided control signals shown in FIG. 6A are different from those in FIGS. 4A and 5A. As shown in FIG. 6A, a first control current provided to the upper-branch compound Josephson junction, e.g., from SRC2 306 in FIG. 3, labeled I_Probe2.i, is turned on starting at 1 nanosecond, to peak at 10 microamps by 2 nanoseconds, then reversed starting at 3 nanoseconds, to dip to −10 microamps by 5 nanoseconds, and finally turned off starting at 6 nanoseconds, to return to 0 microamps by 7 seconds. A second control current provided to the lower-branch compound Josephson junction, e.g., from SRC4 304 in FIG. 3, labeled I_Probe3.i, is programmed to follow an identical piecewise linear pattern up through the 7-nanosecond mark, but rather than to be zeroed from this time on, to return to 10 microamps by 8 nanoseconds, and to go negative starting at 9 nanoseconds, to −10 microamps by 11 nanoseconds, after which it is turned off at 12 nanoseconds, to return to 0 microamps by 13 nanoseconds. The resultant output current in FIG. 6B remains at zero all during the time when the two control currents are identical, even if the control currents are nonzero, i.e., between 0 and 7 nanoseconds and after 13 nanoseconds. It is only during times when the two control currents are different and at least one is nonzero that the 20 gigahertz input AC signal provided by SRC3 302 in FIG. 3 is passed through to the output, indicating that the input has been coupled to the output. FIGS. 6A and 6B thus illustrate that any signal that tunes both of the coupler's compound Josephson junctions in tandem does not create a coupling. Accordingly, the coupler's tuning control is immune to common-mode noise.

The push-pull tunable coupler of the present disclosure can be constructed with a low component count and either a simplified or flexible control architecture. In addition to having reduced sensitivity to differential-mode noise around the off state, the push-pull tunable coupler of the present disclosure is completely insensitive to common-mode noise. It furthermore can provide signal inversion with no additional components necessary.

Figure 7:
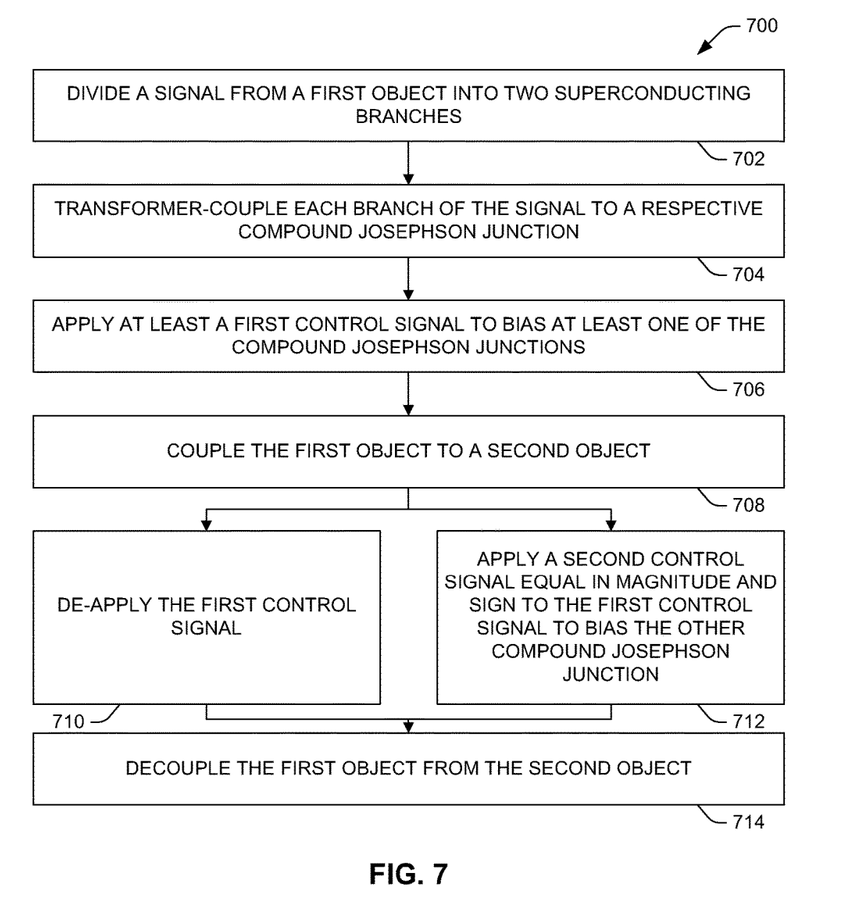
FIG. 7 is a flow chart illustrating an example method of coupling two quantum objects.

FIG. 7 illustrates a method 700 of tunably coupling or uncoupling two objects. A signal from a first object is divided 702 into two superconducting branches. Each branch of the signal is transformer-coupled 704 to a respective compound Josephson junction. At least a first control signal is applied 706 to bias at least one of the compound Josephson junctions, thereby coupling 708 the first object to a second object by permitting the exchange of information between the objects via a coupling signal. The objects can be decoupled 714 either by de-applying 710 the first control signal or by applying 712 a second control signal equal in magnitude and sign to the first control signal to bias the other one of the compound Josephson junctions (i.e., other than the compound Josephson junction biased by the first control signal).

Further to the method 700, a second control signal greater than the first control signal can be applied to bias the other one of the compound Josephson junctions (i.e., other than the compound Josephson junction biased by the first control signal), thereby inverting the coupling signal. Additionally, the coupling signal can be increased quadratically based on a linear increase in the control signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting push-pull tunable coupler system comprising:
   a push-pull tunable coupler comprising a push transformer, a pull transformer, and first and second compound Josephson junctions;
   a first object connected to a first port of the coupler;
   a second object connected to a second port of the coupler; and
   at least one bias element configured to bias at least one of the first or second compound Josephson junction to unbalance the push and pull of the coupler transformers,
   wherein the coupler is configured such that a balance between the transformers establishes a differential mode in which the first and second objects are uncoupled to prevent signals from passing between the objects, and an imbalance between the transformers establishes a common mode in which the objects are coupled to pass signals between the objects.

2. The system of claim 1, further comprising a coupler controller configured to control the setting of the coupler between differential mode and the common mode by changing the compound Josephson junctions between opposing inductance states and thereby balancing or unbalancing the coupler.

3. The system of claim 2, wherein the coupler controller controls an amount and polarity of current through at least one flux bias control line inductively coupled to at least one of the first and second compound Josephson junctions to alternate the coupler between the differential mode and the common mode.

4. The system of claim 1, wherein the first port branches signals from the first object among a split inductor, the push transformer comprising a first portion of the split inductor and the pull transformer comprising a second portion of the split inductor.

5. The system of claim 1, wherein the first and second compound Josephson junctions are connected at the second port.

6. The system of claim 1, wherein the coupler is configured such that a coupling current of the coupler increases quadratically with a linear increase in a control current.

7. The system of claim 1, comprising a first bias element configured to provide a first flux bias current to bias the first compound Josephson junction and a second bias element configured to provide a second flux bias current to bias the second compound Josephson junction.

8. The system of claim 7, wherein the coupler is configured to be insensitive to common-mode noise in the first and second bias currents.

9. The system of claim 7, further comprising a coupler controller configured to control an amount and polarity of the first flux bias current and an amount and polarity of the second flux bias current to alternate the coupler between the differential mode and the common mode.

10. The system of claim 7, wherein the coupler is configured to invert a coupling current based on the first flux bias current being greater than the second flux bias current.

11. A method of tunably coupling or uncoupling two objects, the method comprising:
    dividing a signal from a first object into two superconducting branches;
    transformer-coupling each branch of the signal to a respective compound Josephson junction; and
    applying at least a first control signal to bias at least one of the compound Josephson junctions,
    thereby coupling the first object to a second object by permitting the exchange of information between the objects via a coupling signal.

12. The method of claim 11, further comprising de-applying the first control signal, thereby decoupling the first object from the second object.

13. The method of claim 11, further comprising applying a second control signal equal in magnitude and sign to the first control signal to bias the other one of the compound Josephson junctions than the compound Josephson junction biased by the first control signal, thereby decoupling the first object from the second object.

14. The method of claim 11, further comprising applying a second control signal greater than the first control signal to bias the other one of the compound Josephson junctions than the compound Josephson junction biased by the first control signal, thereby inverting the coupling signal.

15. The method of claim 11, furthering comprising increasing the coupling signal quadratically based on a linear increase in the control signal.

16. A superconducting load-compensated tunable coupler comprising:
    a split inductor to receive an input signal from a first object at an input node located between the ends of the split inductor, each end of the split inductor being connected to a low-voltage rail;
    an upper branch comprising:
        a first flux transformer comprising an upper portion of the split inductor and a second inductor, transformer-coupled to the upper portion of the split inductor, connected between the low-voltage rail and an upper-middle node, the configuration of the connections of the first flux transformer to the low voltage rail giving the first flux transformer a first polarity; and
        a first compound Josephson junction connected between the upper-middle node and an output node; and
    a lower branch comprising:
        a second flux transformer comprising a lower portion of the split inductor and a third inductor, transformer-coupled to the lower portion of the split inductor, connected between the low-voltage rail and a lower-middle node, the configuration of the connections of the second flux transformer to the low voltage rail giving the second flux transformer a second polarity opposite to the first polarity; and
a second compound Josephson junction connected between the lower-middle node and the output node.

17. The coupler of claim 16, wherein the first and second compound Josephson junctions each comprise two Josephson junctions in parallel.

18. The coupler of claim 17, wherein the first and second compound Josephson junctions each further comprise at least one inductor transformer-coupled to a respective flux bias line.

19. The coupler of claim 18, wherein the coupler is completely insensitive to common-mode noise that equally affects the respective flux bias line of both compound Josephson junctions.

20. The coupler of claim 17, wherein all of the Josephson junctions are substantially equal in size.

* * * * *